(12) United States Patent
Dewey et al.

(10) Patent No.: US 12,068,319 B2
(45) Date of Patent: Aug. 20, 2024

(54) HIGH PERFORMANCE SEMICONDUCTOR OXIDE MATERIAL CHANNEL REGIONS FOR NMOS

(71) Applicant: INTEL CORPORATION, Santa Clara, CA (US)

(72) Inventors: Gilbert Dewey, Beaverton, OR (US); Willy Rachmady, Beaverton, OR (US); Jack T. Kavalieros, Portland, OR (US); Cheng-Ying Huang, Portland, OR (US); Matthew V. Metz, Portland, OR (US); Sean T. Ma, Portland, OR (US); Harold Kennel, Portland, OR (US); Tahir Ghani, Portland, OR (US); Abhishek A. Sharma, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 1035 days.

(21) Appl. No.: 16/141,000

(22) Filed: Sep. 25, 2018

(65) Prior Publication Data
US 2020/0098753 A1  Mar. 26, 2020

(51) Int. Cl.
| H01L 27/092 | (2006.01) |
| H01L 21/02 | (2006.01) |
| H01L 21/28 | (2006.01) |
| H01L 29/10 | (2006.01) |
| H01L 29/267 | (2006.01) |

(Continued)

(52) U.S. Cl.
CPC ...... *H01L 27/092* (2013.01); *H01L 21/02164* (2013.01); *H01L 21/02175* (2013.01); *H01L 21/022* (2013.01); *H01L 21/28194* (2013.01); *H01L 29/1054* (2013.01); *H01L 29/267* (2013.01); *H01L 29/517* (2013.01); *H01L 29/66537* (2013.01); *H01L 29/6659* (2013.01)

(58) Field of Classification Search
CPC ............ H01L 27/092; H01L 21/02164; H01L 21/02175; H01L 21/022; H01L 21/28194; H01L 29/1054; H01L 29/267; H01L 29/517; H01L 29/66537; H01L 29/6659
See application file for complete search history.

(56) References Cited

U.S. PATENT DOCUMENTS

| 2015/0144999 A1* | 5/2015 | Ching | H01L 21/2255 |
| | | | 257/190 |
| 2015/0145048 A1* | 5/2015 | Cheng | H01L 27/0924 |
| | | | 438/154 |

(Continued)

*Primary Examiner* — Monica D Harrison
*Assistant Examiner* — Andre C Stevenson
(74) *Attorney, Agent, or Firm* — Schwabe, Williamson & Wyatt P.C.

(57) ABSTRACT

Techniques are disclosed for integrating semiconductor oxide materials as alternate channel materials for n-channel devices in integrated circuits. The semiconductor oxide material may have a wider band gap than the band gap of silicon. Additionally or alternatively, the high mobility, wide band gap semiconductor oxide material may have a higher electron mobility than silicon. The use of such semiconductor oxide materials can provide improved NMOS channel performance in the form of less off-state leakage and, in some instances, improved electron mobility as compared to silicon NMOS channels.

20 Claims, 8 Drawing Sheets

(51) Int. Cl.
*H01L 29/51* (2006.01)
*H01L 29/66* (2006.01)

(56) References Cited

U.S. PATENT DOCUMENTS

| | | | |
|---|---|---|---|
| 2016/0027699 A1* | 1/2016 | Chien | H01L 29/7848 |
| | | | 438/283 |
| 2017/0018616 A1* | 1/2017 | Zan | H01L 21/461 |
| 2018/0240797 A1* | 8/2018 | Yokoyama | H01L 23/528 |
| 2020/0006331 A1* | 1/2020 | Lilak | H01L 21/823431 |

* cited by examiner

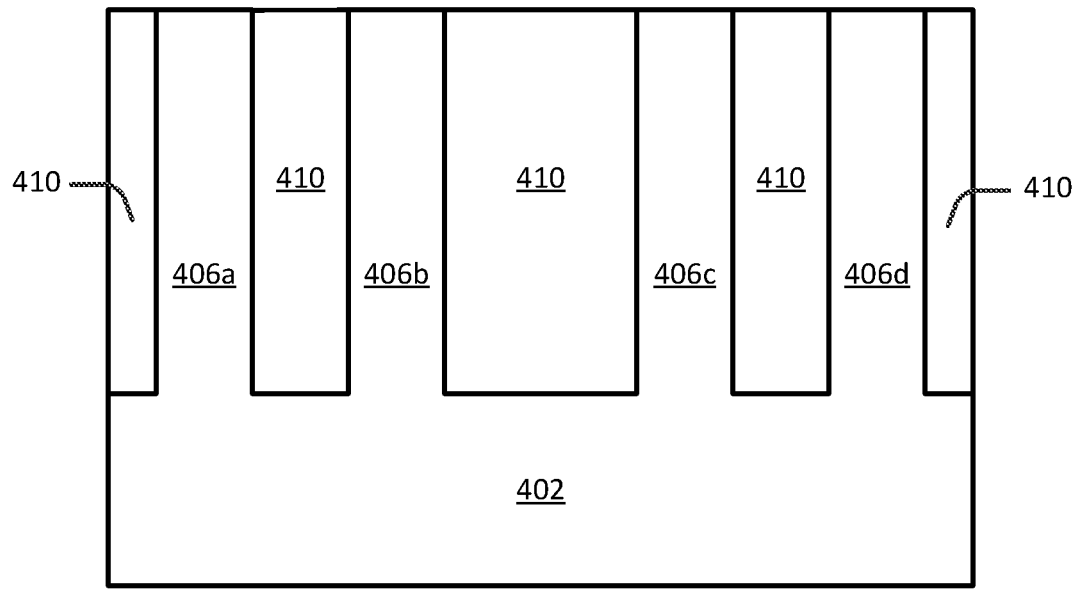
FIG. 4C
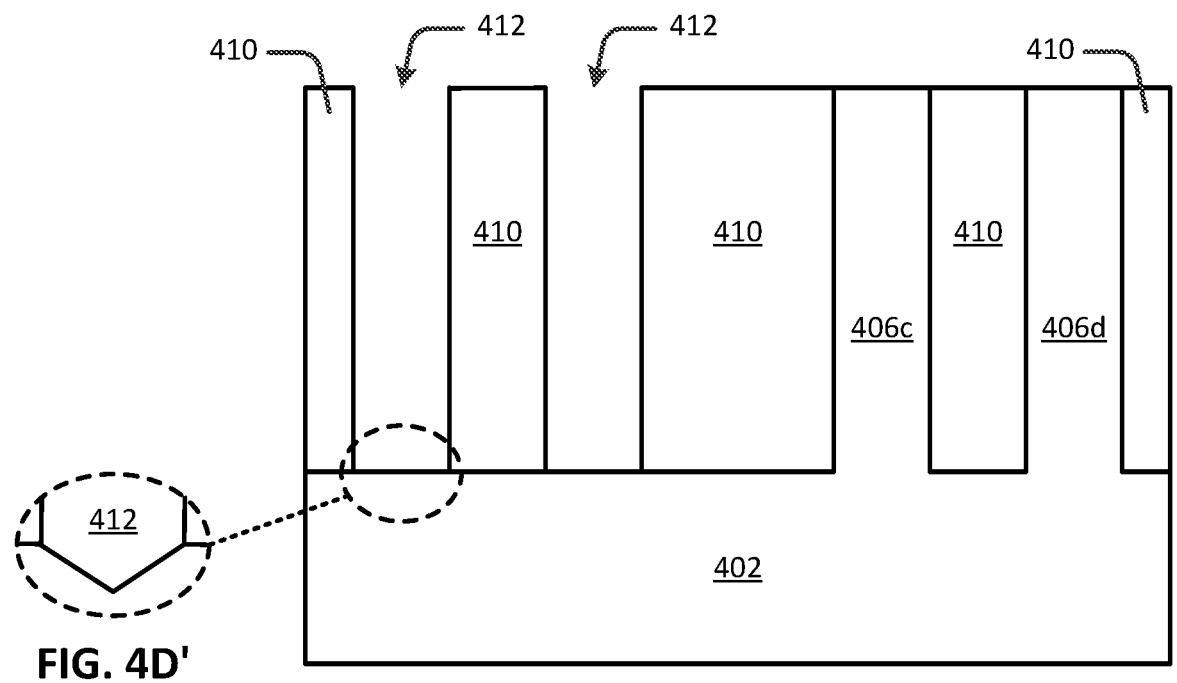
FIG. 4D'
FIG. 4D

HIGH PERFORMANCE SEMICONDUCTOR OXIDE MATERIAL CHANNEL REGIONS FOR NMOS

BACKGROUND

Semiconductor devices are electronic components that exploit the electronic properties of semiconductor materials, such as silicon (Si), germanium (Ge), and silicon germanium (SiGe). A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow from the source to the drain. In instances where the charge carriers are electrons, the FET is referred to as an n-channel device, and in instances where the charge carriers are holes, the FET is referred to as a p-channel device. Standard dopant used for Si, Ge, and SiGe includes boron (B) for p-type (acceptor) dopant and phosphorous (P) or arsenic (As) for n-type (donor) dopant. In addition, metal-oxide-semiconductor FETs (MOSFETs) include a gate dielectric between the gate and the channel. MOSFETs may also be known as metal-insulator-semiconductor FETs (MISFETSs) or insulated-gate FETs (IGFETs). Complementary MOS (CMOS) structures use a combination of p-channel MOSFET (PMOS) and n-channel MOSFET (NMOS) to implement logic gates and other digital circuits.

A FinFET is a MOSFET transistor built around a thin strip of semiconductor material (generally referred to as a fin). The conductive channel of the FinFET device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations includes three different planer regions of the fin (e.g., top and two sides), such a FinFET design is sometimes referred to as a tri-gate transistor. Other types of FinFET configurations are also available, such as so-called double-gate FinFETs, in which the conductive channel principally resides only along the two sidewalls of the fin (and not along the top of the fin).

BRIEF DESCRIPTION OF THE DRAWINGS

FIGS. 4A to 4H illustrate cross-sectional views of example integrated circuit structures that are formed when carrying out the process of FIG. 3, in accordance with an embodiment of the present disclosure. FIG. 4D' illustrates a "V"-shaped facet created at a bottom of a fin-shaped trench as a result of etching a fin, in accordance with an embodiment of the present disclosure.

Figure 1:
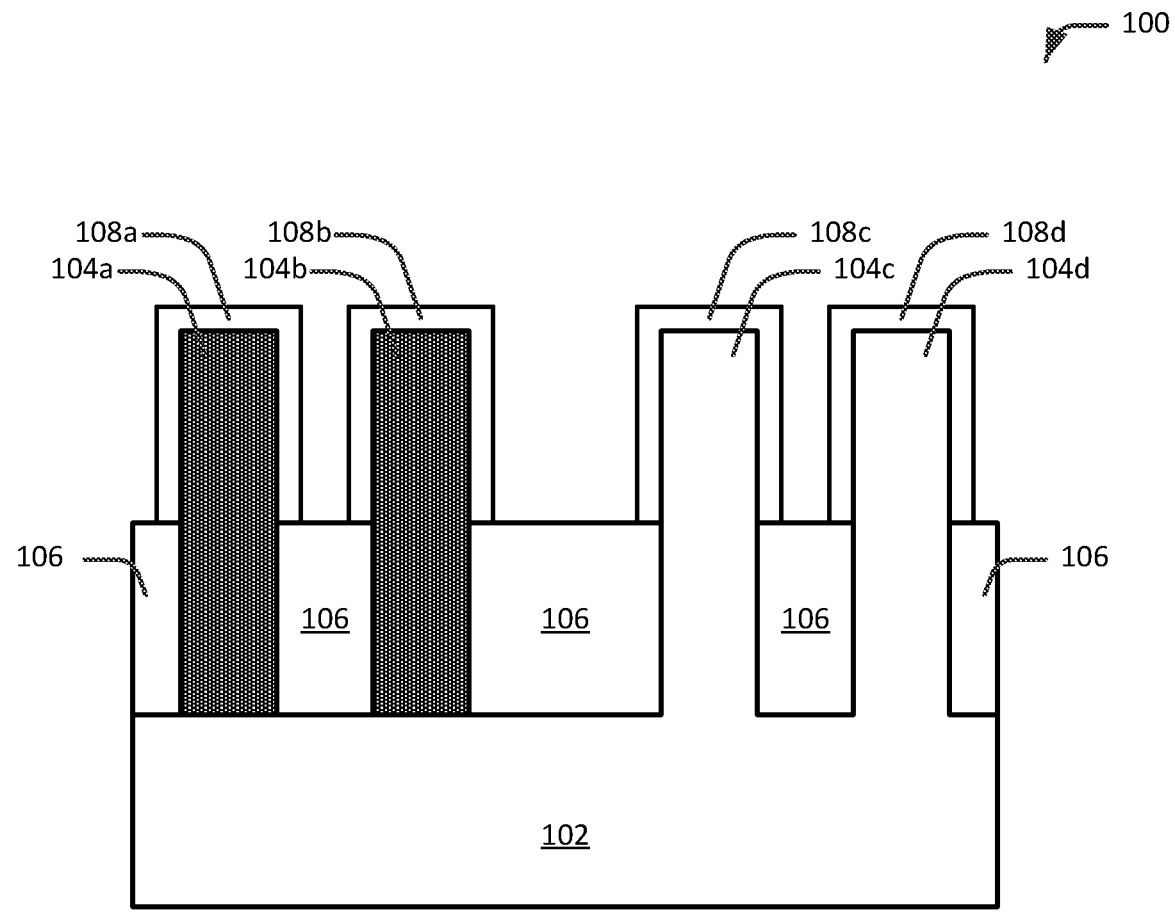
FIG. 1 illustrates a cross-sectional view of an integrated circuit structure including a high mobility, wide band gap semiconductor oxide material for n-channel devices, in accordance with an embodiment of the present disclosure.

These and other features of the present embodiments will be understood better by reading the following detailed description, taken together with the figures herein described. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is merely provided to assist in visually identifying the different features. In short, the figures are provided merely to show example structures.

DETAILED DESCRIPTION

Techniques are disclosed herein for integrating high mobility, wide band gap semiconductor oxide materials as alternate channel materials in integrated circuits. As will be appreciated in light of this disclosure, an alternate channel material is a material that is compositionally different from the substrate material on which the channel material rests. For instance, for CMOS structures on an silicon substrate according to some embodiments, a channel region comprised of a high mobility, wide band gap semiconductor oxide material is provided for n-channel devices (e.g., NMOS devices) and a channel region comprised of a native material (i.e., part of or otherwise the same material as the underlying substrate) is provided for p-channel devices (e.g., PMOS devices). In some such embodiments, the high mobility, wide band gap semiconductor oxide material has a wider band gap than the band gap of silicon (Si). Additionally or alternatively, the high mobility, wide band gap semiconductor oxide material may have a higher electron mobility than silicon. Such high mobility, wide band gap semiconductor oxides include, for instance, oxygen and one or more other materials, such as one or more of indium (In), gallium (Ga), zinc (Zn), copper (Cu), tin (Sn), nickel (Ni), titanium (Ti), aluminum (Al), or antimony (Sb), to provide some examples. Note that such high mobility, wide band gap semiconductor oxide material is particularly well-suited for NMOS channel regions. In such cases, the channel material provided for PMOS channel regions may be native to (part of) the underlying silicon substrate, or some replacement material (e.g., germanium or silicon germanium) deposited into the channel region. In any such cases, the combination of wide band gap and high electron mobility materials can be used to provide improved performance in the form of less off-state leakage and, in some instances, improved electron mobility in NMOS devices, as will be appreciated in light of this disclosure.

General Overview

As previously explained, the channel is a conductive region that connects the source and drain in a FET device, when proper biasing is applied. One factor in the design of semiconductor transistor devices is the mobility of the carrier flowing within the channel. Improved carrier mobility (e.g., how fast the carrier moves through the channel) translates to improved semiconductor performance. However, existing solutions commonly use silicon as the channel material, and carrier mobility provided by silicon channels is finite. For example, typical silicon carrier mobilities are about 200 $cm^2/Vs$. To this end, group III-V semiconductor materials can be used as replacement channel materials in semiconductor transistor devices for certain applications. Group III-V semiconductor materials typically provide high carrier mobilities. For example, as compared to silicon or other group IV semiconductor materials, some group III-V semiconductor materials, such as indium gallium arsenide (InGaAs), indium phosphide (InP), and indium arsenide (InAs), have carrier mobilities as high as 30,000 $cm^2/Vs$. The high carrier mobilities allow group III-V semiconductor material transistor devices to operate much faster than group IV semiconductor material transistor devices at high currents (e.g., when the device is biased to an on-state to allow current flow). Despite the higher carrier mobilities and the potential for faster operating speeds, there are some non-trivial issues associated with group III-V semiconductor material transistor devices. One such issue is leakage current resulting from the small band gaps typically associated with group III-V semiconductor materials. Leakage current, sometimes referred to as band-to-band tunneling (BTBT), can be quite high in small band gap semiconductor material transistor devices. BTBT is the effect when charge carriers flow (or "tunnel") from a channel region to a drain region (or vice versa) of a semiconductor device when the device is biased to an off-state so as to prevent current flow. For example, when a low voltage is applied to a semiconductor gate in an NMOS device and a high voltage is applied to a corresponding drain region, a high gradient electric field is generated between the gate and the drain region. This electric field can cause charge carries (e.g., electrons in this NMOS example, but more generally majority charge carriers) to tunnel from the valence band of the channel region to the conduction band of the drain region. This BTBT (e.g., BTBT of electrons in this NMOS example) leads to a phenomenon referred to as gate induced drain leakage (GIDL), which is an off-state leakage current. Note that the GIDL can be quite high in small band gap semiconductor material transistor devices. Further note that the GIDL is exponential as a function of the high voltage applied to the drain region. That is, a percentage increase, for example, 20%, 30%, etc., in the high voltage applied to the drain region can result in an exponential increase, for example, 10×, 100×, or even larger, in the GIDL, as compared to a corresponding percentage increase. An undesirable consequence of GIDL is the reduction in gate control, making small band gap semiconductor material transistor devices harder to bias to an off-state (e.g., little or no current flow through the device). Another issue is that group III-V semiconductor materials and germanium (Ge) are not sufficiently lattice matched to silicon and thus tend to suffer from crystalline defects when deposited on silicon.

Thus, techniques are disclosed herein for integrated circuits configured with high mobility, wide band gap semiconductor oxides as alternate channel materials for NMOS devices. In some embodiments, the high mobility, wide band gap semiconductor oxides used as alternate channel materials for NMOS may have wider band gap than the band gap of silicon. Additionally or alternatively, the high mobility, wide band gap semiconductor oxides used as alternate channel materials for NMOS may have higher electron mobilities than silicon. In a more general sense, the combination of the wider wide band gap and high electron mobility associated with such semiconductor oxides provides enhanced NMOS channel performance as compared to silicon NMOS channels. That is, even in the case of a semiconductor oxide having lower electron mobility than Si, the wider band gap as compared to the band gap of silicon will result in a lower off-state leakage, thus resulting in higher performance due to the lower power benefit over silicon channels. Note that the electron mobility of a semiconductor oxide may depend on factors such as deposition temperature, impurities, and annealing conditions, for instance. For example, the electron mobility in IGZO can be in the rage of 10-200 $cm^2/Vs$ depending on deposition and annealing conditions.

In some embodiments, the high mobility, wide band gap semiconductor oxide materials have a band gap in a range of about 1.5 eV to about 3 eV, and electron mobility in a range of about 50 $cm^2/Vs$ to about 500 $cm^2/Vs$ (or in a sub-range of 50 $cm^2/Vs$ to 250 $cm^2/Vs$, 50 $cm^2/Vs$ to 300 $cm^2/Vs$, 50 $cm^2/Vs$ to 350 $cm^2/Vs$, 50 $cm^2/Vs$ to 400 $cm^2/Vs$, 50 $cm^2/Vs$ to 450 $cm^2/Vs$, 100 $cm^2/Vs$ to 250 $cm^2/Vs$, 100 $cm^2/Vs$ to 300 $cm^2/Vs$, 100 $cm^2/Vs$ to 350 $cm^2/Vs$, 100 $cm^2/Vs$ to 400 $cm^2/Vs$, 100 $cm^2/Vs$ to 450 $cm^2/Vs$, 100 $cm^2/Vs$ to 500 $cm^2/Vs$, 150 $cm^2/Vs$ to 300 $cm^2/Vs$, 150 $cm^2/Vs$ to 350 $cm^2/Vs$, 150 $cm^2/Vs$ to 400 $cm^2/Vs$, 150 $cm^2/Vs$ to 450 $cm^2/Vs$, 150 $cm^2/Vs$ to 500 $cm^2/Vs$, 200 $cm^2/Vs$ to 350 $cm^2/Vs$, 200 $cm^2/Vs$ to 400 $cm^2/Vs$, 200 $cm^2/Vs$ to 450 $cm^2/Vs$, or 200 $cm^2/Vs$ to 500 $cm^2/Vs$). The high mobility, wide band gap semiconductor oxide materials have a wider band gap than silicon, and use of such high mobility, wide band gap semiconductor oxide materials in an NMOS channel region provides less off-state leakage as compared to a silicon NMOS channel due to the wider band gap as compared to the smaller band gap of silicon (which is about 1.1 eV). In cases where the high mobility, wide band gap semiconductor oxide materials have higher electron mobility than silicon, use of such high mobility, wide band gap semiconductor oxide material in an NMOS channel region provides an increase in electron mobility through the NMOS channel as compared to a silicon NMOS channel. As noted above, even in cases where the high mobility, wide band gap semiconductor oxide materials have higher electron mobility than silicon, use of such high mobility, wide band gap semiconductor oxide material in an NMOS channel region provides less off-state leakage due to the wider band gap as compared to the band gap of silicon. In any such cases, the high mobility, wide band gap semiconductor oxide NMOS channels provide enhanced performance over silicon NMOS channels in the form of increased gate control (as a result of the wider band gap) and/or higher electron mobility. In addition, the high mobility, wide band gap semiconductor oxide materials are characterized as either amorphous or nanocrystalline, and, as a result, do not need to grow crystallographically. Thus, the high mobility, wide band gap semiconductor oxide materials do not require a crystalline substrate for deposition but can be deposited on any surface (e.g., substrate). Moreover, the high mobility, wide band gap semiconductor oxide materials can be deposited at low temperatures, such as 400° C., and such high mobility, wide band gap semiconductor oxide materials can withstand temperatures up to about 600° C. Thus, the deposition of such high mobility, wide band gap semiconductor oxide materials is compatible with the temperature range of silicon CMOS fabrication processes.

Notwithstanding the wide band gap associated with the high mobility, wide band gap semiconductor oxides, such semiconductor oxides may not be appropriate for use as channel materials for PMOS devices. This may be due to the lower hole mobility associated with the high mobility, wide band gap semiconductor oxide materials as compared to the hole mobility associated with silicon, for instance. So, for PMOS devices, silicon can be used as a channel material. In other embodiments, suitable alternate channel materials that have higher hole mobility than silicon can be used as channel materials for PMOS devices.

Use of the techniques and structures provided herein may be detectable using tools such as electron microscopy including scanning/transmission electron microscopy (SEMITEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate the presence of an NMOS gate structure formed over high mobility, wide band gap semiconductor oxide material as described herein. For example, TEM can be useful to show a cross section of the device structure, including a gated channel region comprised of a material distinct from the underlying substrate. In another example, x-ray crystallography can be useful to illustrate the crystal quality of the high mobility, wide band gap semiconductor oxide material. In some embodiments, the techniques described herein may be detected based on the benefits derived from their use, which include improved carrier mobility in silicon CMOS devices, relatively better control, and/or other improved device performance. Numerous configurations and variations will be apparent in light of this disclosure.

Materials that are compositionally different as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally different may further refer to two materials that have different crystallographic orientations. For instance, (110) silicon is different from (100) silicon. Creating a stack of different orientations could be accomplished, for instance, with blanket wafer layer transfer.

Note that the use of "source/drain" herein is simply intended to refer to a source region or a drain region or both a source region and a drain region. To this end, the forward slash ("/") as used herein means "and/or" unless otherwise specified, and is not intended to implicate any particular structural limitation or arrangement with respect to source and drain regions, or any other materials or features that are listed herein in conjunction with a forward slash.

It is noted that designations such "above" or "below" or "top" or "bottom" or "top side" or "bottom side" are not intended to necessarily implicate a limitation as to orientation of the embodiments described herein. Rather, such terminology is simply used in a relative sense to consistently describe a structure as it exists in any one particular orientation and as illustrated herein.

Architecture and Methodology

Figure 2:
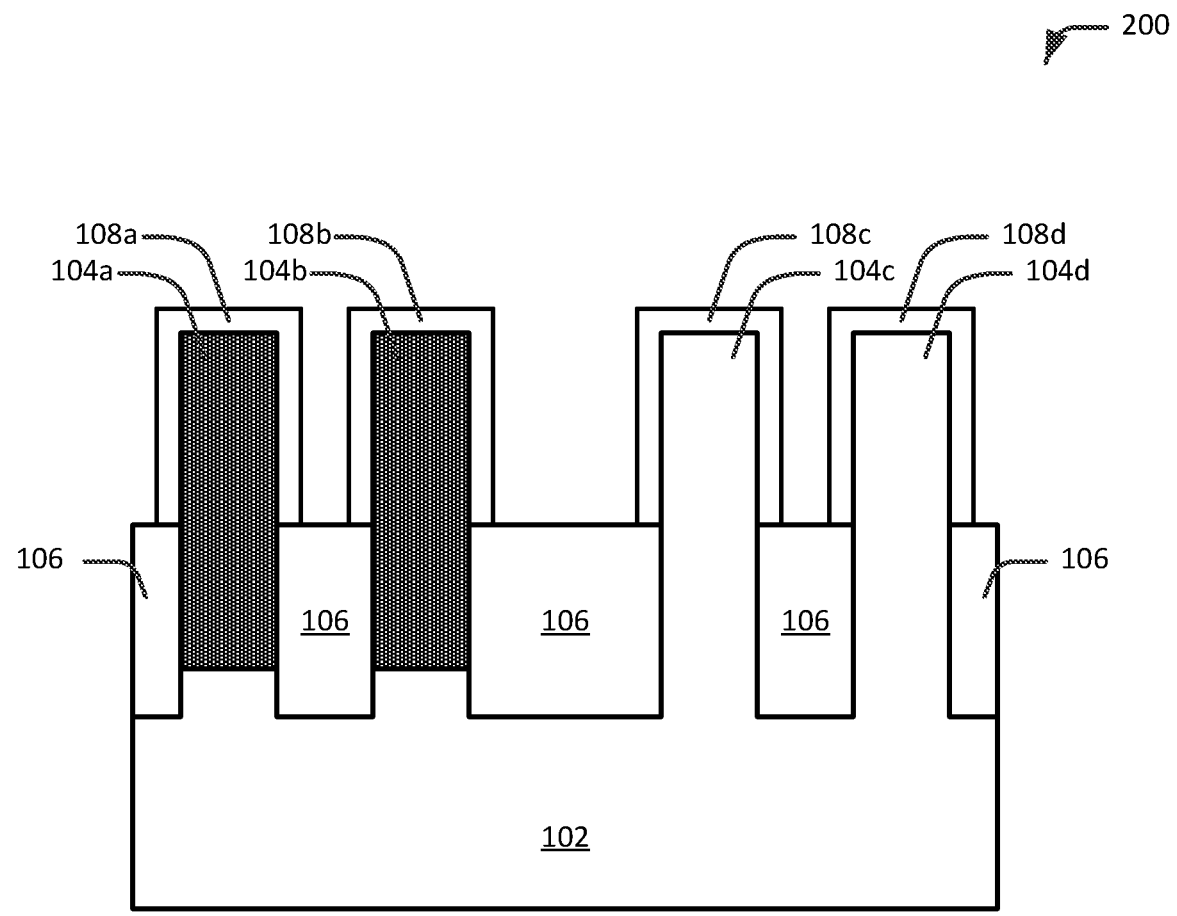
FIG. 2 illustrates a cross-sectional view of an integrated circuit structure including a high mobility, wide band gap semiconductor oxide material for n-channel devices, in accordance with another embodiment of the present disclosure.

FIG. 1 illustrates a cross-sectional view of an integrated circuit structure 100 including a high mobility, wide band gap semiconductor oxide material for n-channel devices, in accordance with an embodiment of the present disclosure. As shown in FIG. 1, integrated circuit structure 100 is depicted through a fin cut perspective (perpendicular to the fins and through the gate/channel region). Integrated circuit structure 100 includes semiconductor fins 104a-104d above a semiconductor substrate 102. Although each fin shown in FIG. 1 is illustrated as having the same size and shape relative to one another, it will be appreciated that the present disclosure is not intended to be so limited. For example, in some embodiments, the fins may be formed to have varying heights and/or varying widths and/or varying shapes. Also note that four fins are shown for ease of illustration, and any number of fins may be present, such as one, two, three, five, ten, hundreds, thousands, millions, and so forth, as can be understood based on this disclosure. In this example embodiment, fins 104a and 104b each include a high mobility, wide band gap semiconductor oxide material, and fins 104c and 104d each include a material that is native to the underlying substrate 102. In this example embodiment, fins 104a and 104b do not include a fin stub portion native to substrate 102. That is, the high mobility, wide band gap semiconductor oxide material portions of fins 104a and 104b may be flush with (e.g., protrude from) the top plane of substrate 102 or, in some instances, may recess into substrate 102 past the top plane of substrate 102. In other embodiments, however, and as illustrated in FIG. 2 and as will be appreciated in light of this disclosure, the fin forming process may leave or otherwise provide fin stubs under the high mobility, wide band gap semiconductor oxide material portions. In such embodiments, as shown in FIG. 2, the stub portions may be continuous with and protrude from substrate 102. In any such cases, the bottom of the high mobility, wide band gap semiconductor oxide portions are flush with or recess into an insulator layer 106 past the top plane of insulator layer 106. In still other embodiments, note that the high mobility, wide band gap semiconductor oxide material portions may be configured as multilayer stacks suitable for forming nanowires or nanoribbons. In such case, the stack may include, for instance, alternating layers of sacrificial material and high mobility, wide band gap semiconductor oxide material. Once the channel region is exposed during gate processing (gate first or gate last processing may be used), the sacrificial material can be removed so as to liberate the nanowires or nanoribbons, followed by final gate stack formation.

In some embodiments, semiconductor substrate 102 is a bulk silicon substrate, such as monocrystalline Si. In other embodiments, semiconductor substrate 102 may be formed using other materials, which may or may not be combined with Si, such as Ge, SiGe, indium antimonide (InSb), lead telluride, indium arsenide (InAs), InP, InGaAs, gallium arsenide (GaAs), or gallium antimonide (GaSb). In a more general sense, any material that may serve as a foundation upon which a semiconductor device may be built or otherwise formed can be used in accordance with embodiments of the present disclosure. As can further be seen, the high mobility, wide band gap semiconductor oxide material (generally shown with cross-hatching) of fins 104a and 104b extends above insulator layer 106. Note that portions of fins 104c and 104d also extend above insulator layer 106. Insulator layer 106 can be formed from any suitable insulator material, such as, for example, silicon dioxide ($SiO_2$).

A gate structure 108 is over one or more of semiconductor fins 104. For example, four gate structures 108a-108d are depicted, each formed over one of semiconductor fins 104 (gate structure 108a is over fin 104a, gate structure 108b is over fin 104b, gate structure 108c is over fin 104c, and gate structure 108d is over fin 104d). In this example case, fins 104a and 104b may be formed for n-channel devices and gate structures 108a and 108b are n-channel gate structures, and fins 104c and 104d may be formed for p-channel devices and gate structures 108c and 108d are p-channel gate structures. Note that four gate structures are shown for ease of illustration, and any number of gate structures may be formed. Also note that, although each gate structure shown in FIG. 1 is illustrated as being formed over a set of one semiconductor fin, it will be appreciated that the present disclosure is not intended to be so limited. For example, in other embodiments, the number of semiconductor fins over which a given gate structure is formed may be a different number of semiconductor fins, such as two, three, or more semiconductor fins. Further, the sets of semiconductor fins can be composed of the same number of semiconductor fins or different numbers of semiconductor fins. For example, in some embodiments, gate structure 108a may be formed over a first set of semiconductor fins, and gate structure 108b may be formed over a second set of semiconductor fins, where the first set and the second set are composed of a different number of semiconductor fins.

Gate structure 108 includes a gate dielectric layer and a gate electrode. In one specific example case, the gate structure includes a silicon dioxide gate dielectric layer and a polysilicon or tungsten gate electrode. In still other embodiments, the gate dielectric layer includes multiple components such as a first layer of a first dielectric material on the channel region, and a second layer of a second dielectric material on the first layer. For instance, the gate dielectric layer may include multiple components such as a lower layer of standard dielectric (e.g., such as silicon dioxide) on the channel region, and an upper layer of high-k dielectric (e.g., such as hafnium oxide) on the standard dielectric layer. Example high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. Likewise, the gate electrode may include multiple components in some embodiments, such as work function metals (a first work function metal for p-type gate electrode and a second work function metal for n-type gate electrodes) and/or barrier materials surrounding a metal core or plug. Any number of gate stack configurations can be used for gate structures 108a-108d, whether high-k or not, as will be appreciated.

Source and drain regions are not expressly shown in the cross-section depicted, but will be apparent. For instance, in FIGS. 1 and 2, if the cross-section were parallel to a given fin 104 rather than perpendicular, highly doped epitaxial source and drain regions could be seen to respective sides of the corresponding gate stack 108. Numerous source/drain region configurations can be used, as will be appreciated in light of this disclosure.

In some example embodiments, the source/drain regions are epitaxial source/drain regions that are provided after the relevant portion of the fin or fin structure was isolated and etched away or otherwise removed. The source/drain material can therefore be compositionally different from the underlying fin 104 or substrate 102 material and/or the channel material. In other embodiments, the source/drain regions may be doped portions of the fin 104, rather than epi source/drain regions. In some embodiments using an etch and epitaxial replacement process, the source/drain regions are faceted and overgrown from a trench within insulator material (e.g., shallow trench isolation, or so-called STI), and a corresponding source or drain contact structure lands on that faceted excess portion. Alternatively, in other embodiments, the faceted excess portion of epi source/drain regions can be removed (e.g., via chemical mechanical planarization, or CMP), and the corresponding source or drain contact structure lands on that planarized portion. As will be further appreciated, in some embodiments, the removal of the original source/drain regions and replacement with epi source/drain material may result in an upper portion of the source/drain region (the overgrowth portion of the epi deposition) which is wider (e.g., by 1-10 nm) than the underlying fin 104 width. Any combination of such features may result.

If present, epi source/drain regions can be any suitable semiconductor material. For instance, PMOS source/drain regions may include, for example, group IV semiconductor materials such as silicon, germanium, SiGe, germanium tin (GeSn), SiGe alloyed with carbon (SiGe:C). Example p-type dopants in silicon, SiGe, or germanium include boron, gallium, indium, and aluminum. NMOS source/drain regions may include, for example, group III-V semiconductor materials such as two or more of indium, aluminum, arsenic, phosphor, gallium, and antimony, with some example compounds including but not limited to indium aluminum arsenide (InAlAs), indium arsenide phosphide (InAsP), InGaAs, indium gallium arsenide phosphide (InGaAsP), gallium antimonide (GaSb), gallium aluminum antimonide (GaAlSb), indium gallium antimonide (InGaSb), or indium gallium phosphide antimonide (InGaPSb). In some specific such example embodiments, for instance, substrate 100 material is germanium, and source/drain regions 105 comprise SiGe (e.g., $Si_{1-x}Ge_x$ where $0.20 \leq x \leq 0.99$; or $Si_xGe_y:C_z$ where $8 \leq x \leq 16$; $80 \leq y \leq 90$; $1 \leq z \leq 4$; $x+y+z=100$). In another embodiment, substrate 100 material could be, for instance, $In_xGa_{1-x}As$ $0.51 \leq x \leq 0.55$; $0.10 \leq y \leq 1.00$ or InAs, and source/drain regions comprise an indium-containing compound (e.g., $In_yAl_{1-y}As$ where $0.60 \leq y \leq 1.00$; or $InAs_yP_{1-y}$ where $0.10 \leq y \leq 1.00$; $In_yGa_{1-y}As_zP_{1-z}$ where $0.25 \leq y \leq 1.00$ and $0.50 \leq z \leq 1.00$; $In_xGa_{1-x}Sb$ where $0.25 \leq x \leq 1.00$, or $In_xGa_{1-x}P_ySb_{1-y}$ where $0.25 \leq x \leq 1.00$; $0.00 \leq y \leq 0.10$). Example N-type dopants include phosphorus, arsenic, and antimony. In a more general sense, source/drain regions can be any semiconductor material suitable for a given application.

In some cases, having epi source/drain regions, the epi source/drain regions may include a multilayer structure, such as a germanium cap on a SiGe body, or a germanium body and a carbon-containing SiGe spacer or liner between the corresponding channel region and that germanium body. In any such cases, a portion of the epi source/drain regions may have a component that is graded in concentration, such as a graded germanium concentration to facilitate lattice matching, or a graded dopant concentration to facilitate low contact resistance.

Source and drain contact structures can also be included in the final structure, as will be further apparent. Source/drain contact structures can have any number of standard configurations. In some example embodiments, the contact structures include a contact metal and a conductive liner or barrier layer, deposited in a contact trench formed in an insulator layer over the source and drain regions. The liner can be, for example, tantalum or tantalum nitride, and metal can be any suitable plug/core material, such as tungsten, aluminum, ruthenium, cobalt, copper, or alloys thereof. In some cases, the contact structures can be optimized p-type and n-type contact structures similar to p-type and n-type gate electrode structures. For instance, according to some such embodiments, the liner can be titanium for NMOS source/drain contact structures, or nickel or platinum for PMOS source/drain contact structures. In still other embodiments, the contact structures may include resistance reducing materials (e.g., nickel, platinum, nickel platinum, cobalt, titanium, germanium, nickel, gold, or alloys thereof such as germanium-gold alloy, or a multilayer structure of titanium and titanium nitride all have good contact resistance), in addition to contact metal and any liner. Other embodiments may be configured differently. In a more general sense, any number of suitable source/drain contact structures can be used in accordance with an embodiment of the present disclosure, as will be appreciated, and the present disclosure is not intended to be limited to any particular such contact structure configurations.

Figure 3:
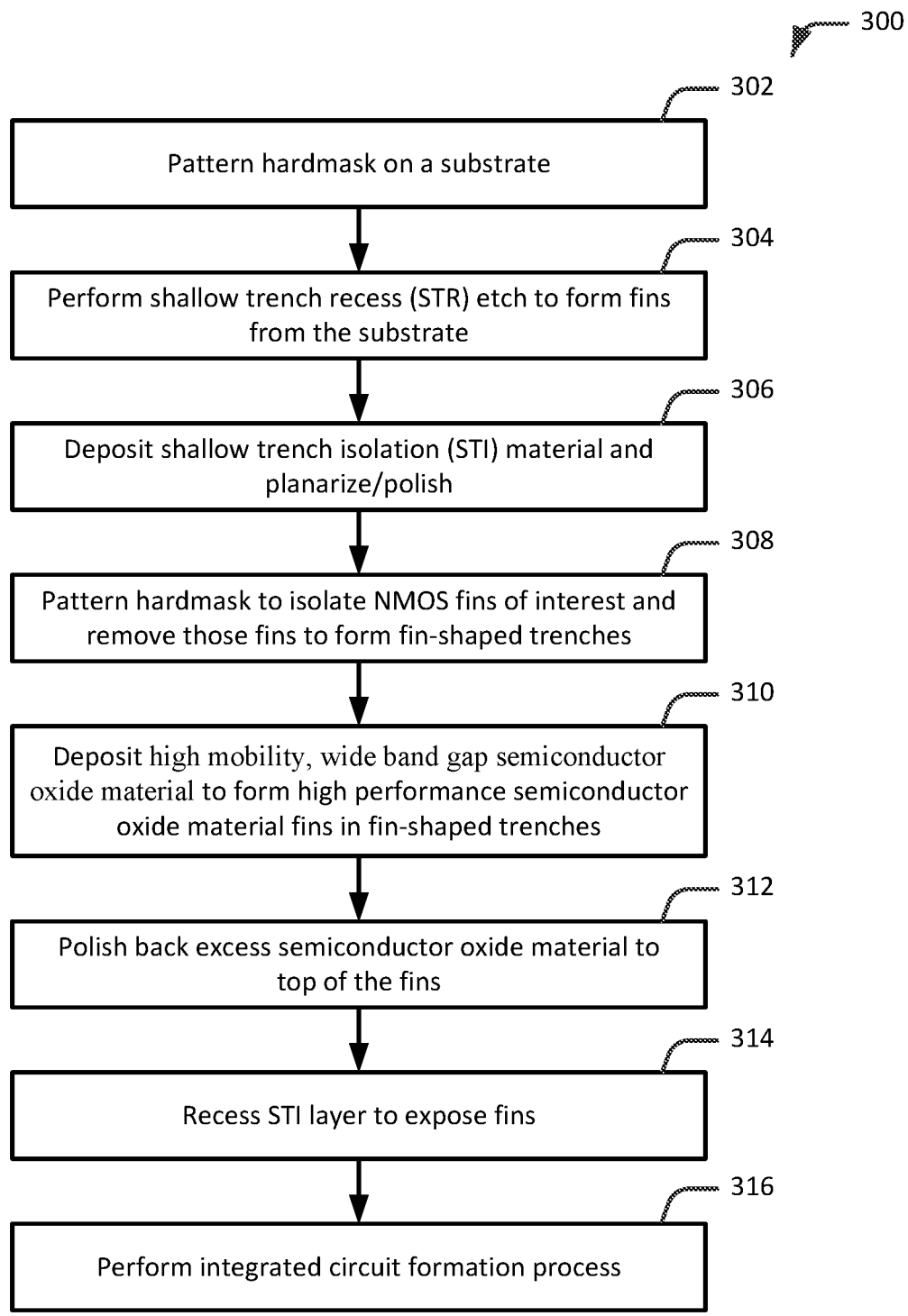
FIG. 3 is a flow diagram illustrating an example process for forming an integrated circuit structure that includes a high mobility, wide band gap semiconductor oxide material for n-channel devices, in accordance with an embodiment of the present disclosure.

FIG. 3 is a flow diagram illustrating an example process 300 for forming an integrated circuit (IC) structure that includes a high mobility, wide band gap semiconductor oxide material for n-channel devices, in accordance with an embodiment of the present disclosure. FIGS. 4A to 4H illustrate cross-sectional views of example IC structures that are formed when carrying out process 300 of FIG. 3, in accordance with an embodiment of the present disclosure. The cross-sectional views in FIGS. 4A to 4H are depicted through a fin cut perspective (perpendicular to the fins and through the gate/channel region) to assist with illustrating the high mobility, wide band gap semiconductor oxide material for n-channel devices. Concurrent reference to FIG. 3 and FIGS. 4A-4H will facilitate explanation.

A multitude of different transistor devices can benefit from the techniques described herein, which includes, but is not limited to, various field-effect transistors (FETs), such as metal-oxide-semiconductor FETs (MOSFETs), tunnel FETs (TFETs), and Fermi filter FETs (FFFETs) (also known as tunnel source MOSFETs), to name a few examples. For example, the techniques can be used to benefit an n-channel MOSFET (NMOS) device. The techniques can be used to benefit transistors including a multitude of configurations, such as planar and/or non-planar configurations, where the non-planar configurations may include finned or FinFET configurations (e.g., dual-gate or tri-gate), gate-all-around (GAA) device configurations (e.g., employing one or more nanowires or nanoribbons), or some combination thereof (e.g., a beaded-fin configuration), to provide a few examples. For instance, process 300 describes a technique for a finned configuration. Further, the techniques are used in some embodiments to benefit complementary transistor circuits, such as complementary MOS (CMOS) circuits, where the techniques may be used to benefit one or more of the included n-channel transistors making up the CMOS circuit. Other example transistor devices that can benefit from the techniques described herein include few to single electron quantum transistor devices, in accordance with some embodiments. Further still, any such devices may employ semiconductor materials that are three-dimensional crystals as well as two dimensional crystals or nanotubes, for example. In some embodiments, the techniques may be used to benefit devices of varying scales, such as IC devices having critical dimensions in the micrometer (micron) range and/or in the nanometer (nm) range (e.g., formed at the 22, 14, 10, 7, 5, or 3 nm process nodes, or beyond).

Note that deposition or epitaxial growth techniques (or more generally, additive processing) where described herein can use any suitable techniques, such as chemical vapor deposition (CVD), physical vapor deposition (PVD), atomic layer deposition (ALD), and/or molecular beam epitaxy (MBE), to provide some examples. Also note that etching techniques (or more generally, subtractive processing) where described herein can use any suitable techniques, such as wet and/or dry etch processing which may be isotropic (e.g., uniform etch rate in all directions) or anisotropic (e.g., etch rates that are orientation dependent), and which may be non-selective (e.g., etches all exposed materials at the same or similar rates) or selective (e.g., etches different materials that are exposed at different rates). Further note that other processing may be used to form the and integrated circuit structures described herein, as will be apparent in light of this disclosure, such as hardmasking, patterning or lithography (via suitable lithography techniques, such as, e.g., photolithography, extreme ultraviolet lithography, x-ray lithography, or electron beam lithography), planarizing or polishing (e.g., via chemical-mechanical planarization (CMP) processing), doping (e.g., via ion implantation, diffusion, or including dopant in the base material during formation), and annealing, to name some examples.

In embodiments where semiconductor material described herein includes a dopant, the dopant is any suitable n-type and/or p-type dopant that is known to be used for the specific semiconductor material. For instance, in the case of group IV semiconductor materials (e.g., Si, SiGe, Ge), p-type dopant includes group III atoms (e.g., boron, gallium, aluminum), and n-type dopant includes group V atoms (e.g., phosphorous, arsenic, antimony). In the case of group III-V semiconductor materials (e.g., GaAs, InGaAs, InP, GaP), p-type dopant includes group II atoms (e.g., beryllium, zinc, cadmium), and n-type dopant includes group VI atoms (e.g., selenium, tellurium). However, for group III-V semiconductor materials, group VI atoms (e.g., silicon, germanium) can be employed for either p-type or n-type dopant, depending on the conditions (e.g., formation temperatures). In embodiments where a dopant is included in semiconductor material, the dopant can be included at quantities in the range of 1E16 to 1E22 atoms per cubic cm, or higher, for example, unless otherwise stated. In some embodiments, a dopant is included in semiconductor material in a quantity of at least 1E16, 1E17, 1E18, 5E18, 1E19, 5E19, 1E20, 5E20, or 1E21 atoms per cubic cm and/or of at most 1E22, 5E21, 1E21, 5E20, 1E20, 5E19, 1E19, 5E18, or 1E18 atoms per cubic cm, for example. In some embodiments, semiconductor material described herein is undoped/intrinsic, or includes relatively minimal dopant, such as a dopant concentration of less than 1E16 atoms per cubic cm, for example.

As will be further appreciated in light of this disclosure, for this and other processes and methods disclosed herein, the functions performed in the processes and methods may be implemented in differing order. Additionally or alternatively, two or more operations may be performed at the same time or otherwise in an overlapping contemporaneous fashion. Furthermore, the outlined actions and operations are only provided as examples, and some of the actions and operations may be optional, combined into fewer actions and operations, or expanded into additional actions and operations without detracting from the essence of the disclosed embodiments.

Figure 4A:

With reference to process 300 of FIG. 3, at block 302, a hardmask is patterned on a substrate. FIG. 4A shows a hardmask 404 patterned on an example substrate 402. In some embodiments, hardmask 404 may be deposited or otherwise formed on substrate 402 using any suitable technique as will be apparent in light of this disclosure. For example, hardmask 404 may be blanket deposited or otherwise grown on substrate 402 using chemical vapor deposition (CVD), atomic layer deposition (ALD), physical vapor deposition (PVD), spin-on processing, and/or any other suitable process to form hardmask 404 on substrate 402. In some instances, the top surface of substrate 402 on which hardmask 404 is to be deposited may be treated (e.g., via chemical treatment, thermal treatment, etc.) prior to deposition of the hardmask 404 material. After being blanket formed on substrate 402, hardmask 404 may then be patterned using any suitable techniques, such as one or more lithography and etch processes, for example. Hardmask 404 may include any suitable material, such as oxide material, nitride material, and/or any other suitable dielectric/electrical insulator material, for example. Specific oxide and nitride materials may include silicon oxide, titanium oxide, hafnium oxide, aluminum oxide, silicon nitride, and titanium nitride, just to name a few examples. In some cases, the material of hardmask 404 may be selected based on the material of substrate 402, for example.

In some embodiments, substrate 402 may be: a bulk substrate including group IV semiconductor material (e.g., Si, Ge, SiGe), group III-V semiconductor material, and/or any other suitable material(s) as will be apparent in light of this disclosure; an X on insulator (XOI) structure where X is one of the aforementioned materials (e.g., group IV and/or group III-V semiconductor material) and the insulator material is an oxide material or dielectric material or some other electrically insulating material, such that the XOI structure includes the electrically insulating material layer between two semiconductor layers; or some other suitable multilayer structure where the top layer includes one of the aforementioned semiconductor materials (e.g., group IV and/or group III-V semiconductor material). The use of "group IV semiconductor material" (or "group IV material" or generally, "IV") herein includes at least one group IV element (e.g., silicon, germanium, carbon, tin), such as silicon (Si), germanium (Ge), silicon germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), and so forth. Note that group III may also be known as the boron group or IUPAC group 13, group IV may also be known as the carbon group or IUPAC group 14, and group V may also be known as the nitrogen family or IUPAC group 15, for example.

In some embodiments, substrate 402 may be selectively doped with any suitable n-type and/or p-type dopant selected in light of the dopant used to dope the fins, including the NMOS fins that are etched and replaced with the high mobility, wide band gap semiconductor material (as described herein). For instance, in the case, of a silicon substrate, the silicon may be p-type doped using a suitable acceptor (e.g., boron) or n-type doped using a suitable donor (e.g., phosphorous, arsenic), to provide some example cases. However, in some embodiments, substrate 402 may be undoped/intrinsic or relatively minimally doped (such as including a dopant concentration of less than 1E16 atoms per cubic cm). In some embodiments, substrate 402 may include a surface crystalline orientation described by a Miller index of (100), (110), or (111), or its equivalents, as will be apparent in light of this disclosure.

In some embodiments, substrate 402 may be used for one or more other IC devices, such as various diodes (e.g., light-emitting diodes (LEDs) or laser diodes), various transistors (e.g., MOSFETs or TFETs), various capacitors (e.g., MOSCAPs), various microelectromechanical systems (MEMS), various nanoelectromechanical systems (NEMS), various radio frequency (RF) devices, various sensors, or any other suitable semiconductor or IC devices, depending on the end use or target application. Accordingly, in some embodiments, the structures described herein may be included in a system-on-chip (SoC) application, as will be apparent in light of this disclosure.

Figure 4B:
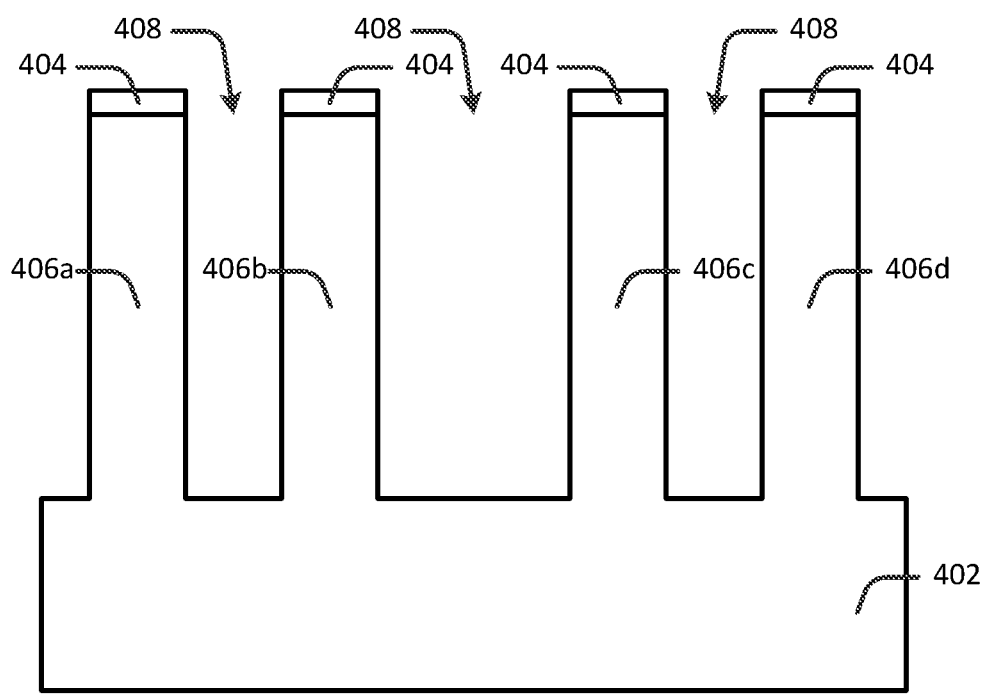

At block 304, a shallow trench recess (STR) etch is performed to form fins from the substrate. FIG. 4B illustrates an example of the resulting structure after formation of fins 406a-406d on substrate 402. In some embodiments, the STR etch used to form trenches 408 and fins 406a-406d may include any suitable techniques, such as various masking processes and wet and/or dry etching processes, for example. In some cases, the STR etch may be performed in-situ/without air break, while in other cases, the STR etch may be performed ex-situ, for example. Trenches 408 may be formed with varying widths (dimension in the horizontal direction) and depths (dimension in the vertical direction) as can be understood based on this disclosure. For example, multiple hardmask patterning and STR etching processes may be performed to achieve varying depths in trenches 408 between fins 406. Fins 406 may be formed to have varying widths (dimension in the horizontal direction) and heights (dimension in the vertical direction). Note that although hardmask structures 404 are still present in the example structure of FIG. 4B, in some cases, that need not be the case, as they may have been consumed during the STR etch, for example.

In some embodiments, the fin widths (dimension in the horizontal direction) is in a range of 2 nm-400 nm (or in a subrange of 2-10, 2-20, 2-50, 2-100, 2-200, 4-10, 4-20, 4-50, 4-100, 4-200, 4-400, 10-20, 10-50, 10-100, 10-200, 10-400, 50-100, 50-200, 50-400, or 100-400 nm), for example, or any other suitable value or range as will be apparent in light of this disclosure. In some embodiments, the fin heights (dimension in the vertical direction) is in a range of 4 nm-800 nm (or in a subrange of 4-10, 4-20, 4-50, 4-100, 4-200, 4-400, 10-20, 10-50, 10-100, 10-200, 10-400, 10-800, 50-100, 50-200, 50-400, 50-800, 100-400, 100-800, or 400-800 nm), for example, or any other suitable value or range as will be apparent in light of this disclosure. In some embodiments, the fin heights is at least 25, 50, 75, 100, 125, 150, 175, 200, 300, 400, or 500, 600, 700, or 800 nm tall, or greater than any other suitable threshold height as will be apparent in light of this disclosure. In some embodiments, the height to width ratio of the fins is greater than 1, such as greater than 1.5, 2, 2.5, 3, 3.5, 4, 4.5, 5, 6, 7, 8, 9, or 10, or greater than any other suitable threshold ratio, as will be apparent in light of this disclosure. Note that trenches 408 and fins 406 are each shown as having essentially the same sizes and shapes in this example structure for ease of illustration; however, the present disclosure is not intended to be so limited. For example, in some embodiments, fins 406 may be formed to have varying heights, varying widths, varying starting points (or varying starting heights), varying shapes, and/or any other suitable variations as will be apparent in light of this disclosure. Moreover, trenches 408 may be formed to have varying depths, varying widths, varying starting points (or varying starting depths), varying shapes, and/or any other suitable variations as will be apparent in light of this disclosure. Further note that although four fins 406a-406d are shown in the example structure of FIG. 4B for ease of illustration, any number of fins may be formed, such as one, two, three, five, ten, hundreds, thousands, millions, billions, and so forth, as can be understood based on this disclosure.

At block 306, a shallow trench isolation (STI) material is deposited in the trenches between the fins, and planarized/polished. FIG. 4C illustrates an example of the resulting structure after deposition of a STI material 410 in trenches 408 and planarizing/polishing to remove the excess STI material 410. In some embodiments, deposition of STI material 410 may include any suitable deposition techniques, such as those described herein (e.g., CVD, ALD, PVD), or any other suitable deposition process. In some embodiments, STI material 410 (which may be referred to as an STI layer) may include any suitable electrically insulating material, such as one or more dielectric, oxide (e.g., silicon dioxide), and/or nitride (e.g., silicon nitride) materials. In some embodiments, the material of STI layer 410 may selected based on the material of substrate 402. For instance, in the case of a silicon substrate, the STI material may be selected to be silicon dioxide or silicon nitride, to provide some examples. In some embodiments, the planarizing and/or polishing process(es) performed after depositing STI material 410 may include any suitable techniques, such as chemical-mechanical planarization/polishing (CMP) processes, for example.

At block 308, a hardmask is patterned on the substrate to isolate NMOS fins of interest, and those fins (the NMOS fins of interest) are removed to form fin-shaped trenches. The hardmask can be, for example, provisioned anew or left intact from the fin forming process as previously described. In any case, the hardmask can be any suitable material that will withstand the fin removal etch of the unmasked fins and subsequent epitaxial processing to fill those trenches. FIG. 4D illustrates an example resulting structure where fins 406c and 406d are masked off with the hardmask, and fins 406a and 406b are left unmasked and removed or otherwise recessed. In the illustrated example case, fins 406a and 406b are determined to be used for NMOS devices (e.g., the fins of interest), and fins 406a and 406b are each recessed to create respective newly formed fin-shaped trenches 412. In such cases, fins 406c and 406d may be native fins. Any suitable etch scheme can be used to recess the fins. In some embodiments, standard wet and/or dry etches are used to remove a bulk of the targeted material, but then low power dry plasma and/or low concentration wet etch, such as NH$_4$OH wet etch, can be used to fine tune the trench bottom morphology to a non-faceted low-ion damage surface upon which the high mobility, wide band gap semiconductor oxide material can be grown or otherwise deposited, so as to provide a hybrid etch scheme.

Note that the recess etch performed at block 308 can be a selective etch such that it will remove the unmasked fin material but none or relatively little of the isolation structures (e.g., STI layer 410 and etch resistant layers and/or caps) or the hardmask. In such a case, note that the hardmask material may also be implemented with the STI material (e.g., silicon dioxide, silicon nitride) or any other material resistant to the fin recess etch scheme. In one specific example embodiment, the fins are silicon and the hardmask is silicon dioxide and/or silicon nitride, and the initial recess etch is carried out using a wet etch (e.g., potassium hydroxide or other suitable etchant that will remove the unmasked silicon fin material but not the STI material), followed by at least one of the low power dry plasma and low concentration NH$_4$OH wet etches to remove any faceting and ion damage so as to fine tune the bottom morphology of the trench(es). The depth of the fin etch can vary from one embodiment to the next, and may leave a pedestal, or a recess into the substrate past the original fin bottom (effectively, the mirror image of a pedestal, across the horizontal direction), or flush with the bottom of the STI trench. In one embodiment, the selective etch is performed with a tetramethylammonium hydroxide (TMAH) chemistry. In such cases, the etching is slowest on the 111 facet and may result in a "V"-shape being created at the bottom of fin-shaped trench 412, as illustrated in FIG. 4D'. As will be further appreciated, the depth of the fin trench (or recess) will depend on factors such as the desired channel configuration and material, substrate thickness, and/or fin height. In some embodiments, the etching process may alter the width of the trench(es), with the top of trench(es) being wider than the bottom in some such cases. In another embodiment where the original native fin was wider at the bottom than the top, the top of the trench may be widened to be closer to or exceed the width at the trench bottom. In yet another embodiment, the recess may end up with a slightly hourglass shape, wider at the top and bottom than in the middle. In yet another embodiment, the width may be substantially unchanged by the etching process. In a more general sense, the shape of the trench(es) may be changed by the etching process (to make wider) or a deposition onto sidewalls of the trench (to make narrower).

At block 310, a high mobility, wide band gap semiconductor oxide material is deposited to form high performance semiconductor oxide material fins in the fin-shaped trenches. Note that the high mobility, wide band gap semiconductor oxide material may be selected to increase electron mobility in NMOS devices. In some embodiments, the high mobility, wide band gap semiconductor oxide material has a higher electron mobility than silicon (where the electron mobility is more than that of silicon, so more than about 200 cm$^2$/Vs). In some embodiments, the high mobility, wide band gap semiconductor oxide material has a wider band gap than silicon (where the band gap is wider than the band gap of silicon, so more than about 1.1 eV). In an example embodiment, the band gap of the high mobility, wide band gap semiconductor oxide materials is in a range of about 1.5 eV to about 3 eV, and the carrier mobility of such high mobility, wide band gap semiconductor oxide materials is in a range of about 50 cm$^2$/Vs to about 500 cm$^2$/Vs (or in a sub-range of 50 cm$^2$/Vs to 250 cm$^2$/Vs, 50 cm$^2$/Vs to 300 cm$^2$/Vs, 50 cm$^2$/Vs to 350 cm$^2$/Vs, 50 cm$^2$/Vs to 400 cm$^2$/Vs, 50 cm$^2$/Vs to 450 cm$^2$/Vs, 100 cm$^2$/Vs to 250 cm$^2$/Vs, 100 cm$^2$/Vs to 300 cm$^2$/Vs, 100 cm$^2$/Vs to 350 cm$^2$/Vs, 100 cm$^2$/Vs to 400 cm$^2$/Vs, 100 cm$^2$/Vs to 450 cm$^2$/Vs, 100 cm$^2$/Vs to 500 cm$^2$/Vs, 150 cm$^2$/Vs to 300 cm$^2$/Vs, 150 cm$^2$/Vs to 350 cm$^2$/Vs, 150 cm$^2$/Vs to 400 cm$^2$/Vs, 150 cm$^2$/Vs to 450 cm$^2$/Vs, 150 cm$^2$/Vs to 500 cm$^2$/Vs, 200 cm$^2$/Vs to 350 cm$^2$/Vs, 200 cm$^2$/Vs to 400 cm$^2$/Vs, 200 cm$^2$/Vs to 450 cm$^2$/Vs, or 200 cm$^2$/Vs to 500 cm$^2$/Vs). Such high mobility, wide band gap semiconductor oxides include oxygen and one or more other materials, such as one or more of indium (In), gallium (Ga), zinc (Zn), copper (Cu), tin (Sn), nickel (Ni), titanium (Ti), aluminum (Al), or antimony (Sb), to provide some examples. For instance, such high mobility, wide band gap semiconductor oxide may include oxygen and In (e.g., in the form of InGaZnO (also referred to as IGZO), InO$_2$, ITO, or InSbO), oxygen and Zn (e.g., in the form of ZnO or AlZnO), oxygen and Ga (e.g., in the form of Ga$_2$O$_3$), oxygen and Cu (e.g., in the form of CuO), oxygen and Sn (e.g., in the form of SnO$_2$), oxygen and Ni (e.g., in the form of NiO), oxygen and Ti (e.g., in the form of $TiO_2$ or TiO), or oxygen and Sb (e.g., in the form of SbO). In some embodiments, the high mobility, wide band gap semiconductor material having higher electron mobility than silicon includes selenium (Se). In some such embodiments where the high mobility, wide band gap semiconductor material includes Se, the high mobility, wide band gap semiconductor material may also include one or more other materials, such as Zn (e.g., in the form of ZnSe), for instance. In the case of InGaZnO, note that the ratio of the element In determines the mobility, where In results in higher mobility. In some such embodiments where the high mobility, wide band gap semiconductor oxide material includes InGaZnO, the ration of In:Ga:Zn can be in the range of 1:1:1 to 9:1:1.

Figure 4E:
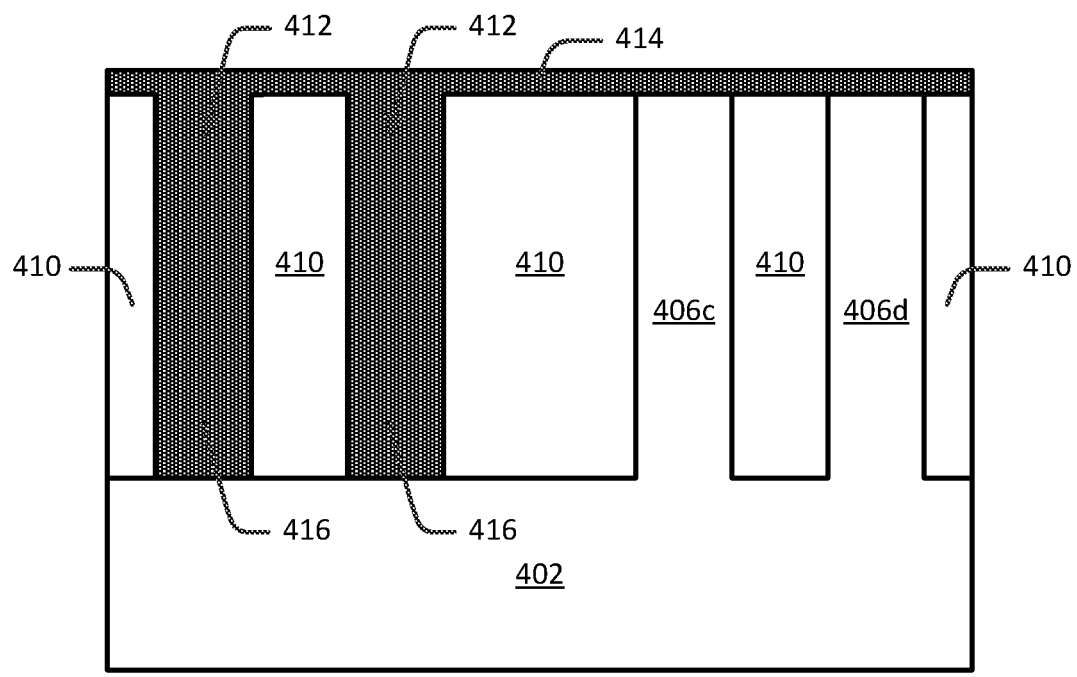

FIG. 4E illustrates an example resulting structure after deposition of a high mobility, wide band gap semiconductor oxide material 414 (or ZnSe) into fin-shaped trenches 412. Deposition of such high mobility, wide band gap semiconductor oxide material 414 into trenches 412 form high performance semiconductor oxide material fins 416 for NMOS devices. In some embodiments, deposition of high mobility, wide band gap semiconductor oxide material 414 may include any suitable deposition techniques, such as those described herein (e.g., CVD, ALD, PVD), or any other suitable deposition process. Note that the deposition may result in some excess material that extends from the surface of STI layer 410 and may be misshapen, faceted, or irregular.

Example trench-based semiconductor fin forming techniques are provided, for instance, in U.S. Patent Application Publication 2014/0027860. In some such cases, the replacement fin material is provided as alternating layers of the desired high mobility, wide band gap semiconductor oxide channel material and sacrificial/inactive material such as described in U.S. Patent Application Publication 2016/0260802. Such multilayer fins are particularly useful for forming nanowire and nanoribbon transistors (e.g., during final gate processing, prior to deposition of final gate materials).

Figure 4F:
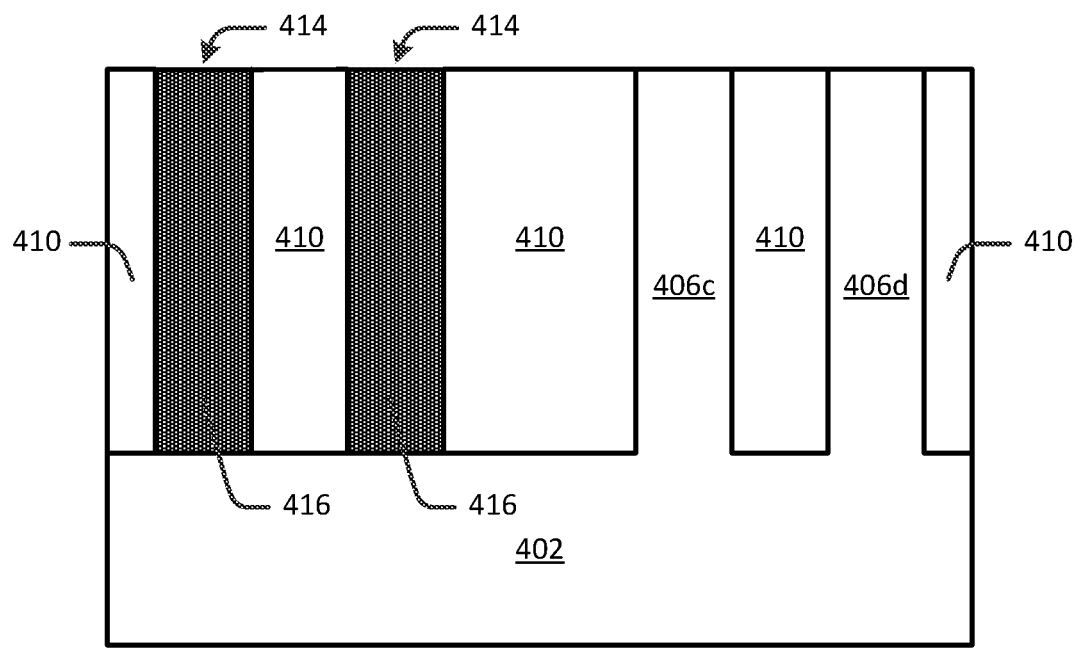

At block 312, any excess high mobility, wide band gap semiconductor oxide material is polished back to the top of the fins. FIG. 4F illustrates an example resulting structure after high mobility, wide band gap semiconductor oxide material 414 is polished back to the top of fins 416 and fins 406c and 406d. Such excess wide band gap semiconductor oxide material can be removed by polishing so that the resulting fins 416 including high mobility, wide band gap semiconductor oxide material 414 and fins 406c and 406d can be co-planar with STI layer 410 as further shown in FIG. 4F. Any suitable polishing technique can be used to polish back the excess high mobility, wide band gap semiconductor oxide material 414.

Figure 4G:
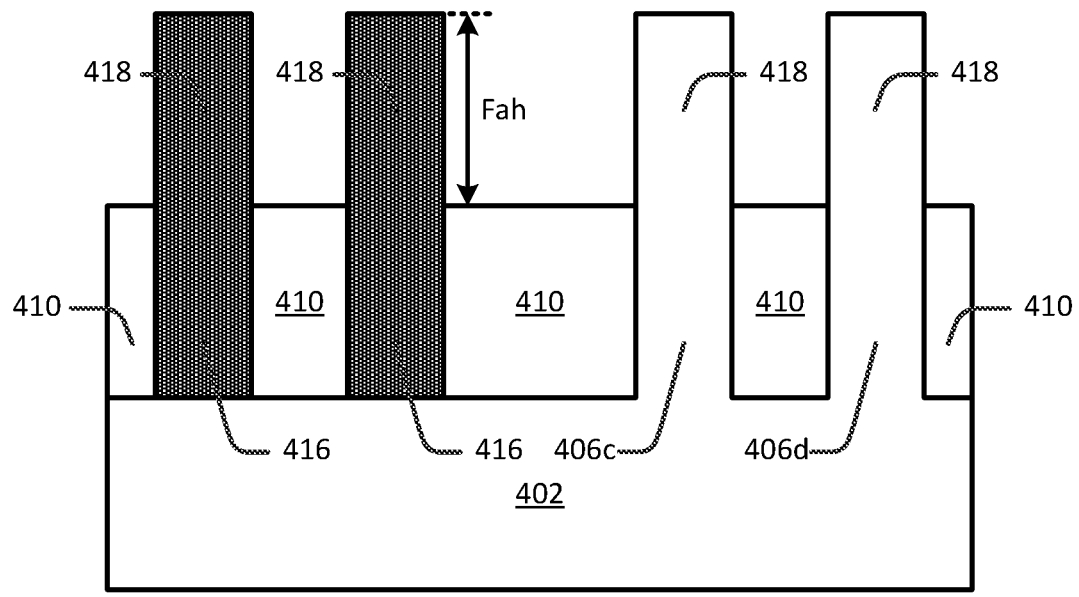

At block 314, the STI layer is recessed to expose the fins. FIG. 4G illustrates an example of the resulting structure after recessing STI layer 410 to expose fins 416 and fins 406c and 406d. As illustrated in FIG. 4G, STI layer 410 is recessed to cause at least respective fin portions 418 of fins 416 and fins 406c and 406d to protrude from the top plane of STI layer 410. In some embodiments, recessing of STI layer 410 may be performed using any suitable techniques, such as using one or more wet and/or dry etch processes that allow STI material 410 to be selectively recessed relative to the material of fins 416 and fins 406c and 406d, and/or any other suitable processing as will be apparent in light of this disclosure. As can be understood based on this disclosure, fin portions 418 may be used in the active channel region of one or more transistors, such that fin portions 418 (the portions of fins 416 and fins 406c and 406d above the top plane of STI layer 410 after the recess has been performed) may be referred to as active fin portions, for example.

As shown in FIG. 4G, respective fin portions 408 of fins 416 and fins 406c and 406d exuding above the top plane of STI layer 410 have an active fin height indicated as Fah, which is in the range of 4 nm-800 nm (e.g., in the subrange of 4-10, 4-20, 4-50, 4-100, 4-200, 4-400, 10-20, 10-50, 10-100, 10-200, 10-400, 10-800, 50-100, 50-200, 50-400, 50-800, 100-400, 100-800, or 400-800 nm), for example, or any other suitable value or range, as will be apparent in light of this disclosure. In some embodiments, the active fin heights Fah may be at least 25, 50, 75, 100, 125, 150, 175, 200, 300, 400, 500, 600, 700, or 800 nm tall, or greater than any other suitable threshold height as will be apparent in light of this disclosure. The active fin height is referred to as such because it is the height of the active fin portion, which is that portion of the fin that is gated (e.g., the portion of the fin that includes the dielectric and metal gate). That is, the active fin portion is the fin region on the top and sides of the fin through which the current flows when the transistor is turned on. In some embodiments, the active height to width ratio of the fins is greater than 1, such as greater than 1.5, 2, 2.5, 3, 3.5, 4, 4.5, 5, 6, 7, 8, 9, or 10, or greater than any other suitable threshold ratio, as will be apparent in light of this disclosure.

Figure 4H:
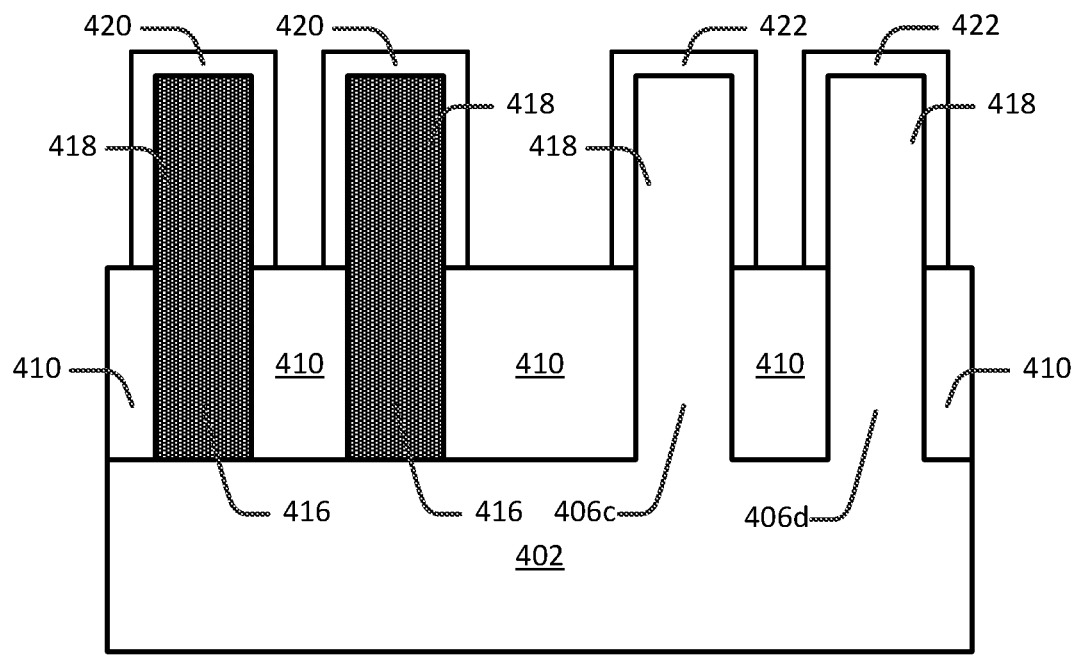

At block 316, the integrated circuit formation process is completed, as needed. For instance, the completion may include, for example, the formation of NMOS and/or PMOS transistors, which may include formation of gate structures over various sets of fins, as well as formation of source/drain regions, contact structure, interconnects, and other such features. For example, as illustrated in FIG. 4H, respective NMOS gate structures 420 may be formed over fin portions 418 of fins 416, and respective PMOS gate structures 422 may be formed over fin portions 418 of fins 406c and 406d. In some embodiments, the integrated circuit formation process includes a gate-first flow (also known as up-front gate processing), where the final gate structure is formed prior to performing the source and drain region processing. Alternatively, in some embodiments, dummy gate structures are initially formed in a gate-last flow (also known as a replacement gate or replacement metal gate (RMG) process). In such cases, the source/drain region processing is carried out after the dummy gate structure(s) are provisioned, but before the final gate structure. Numerous configurations and embodiments will be apparent.

Example System

Figure 5:
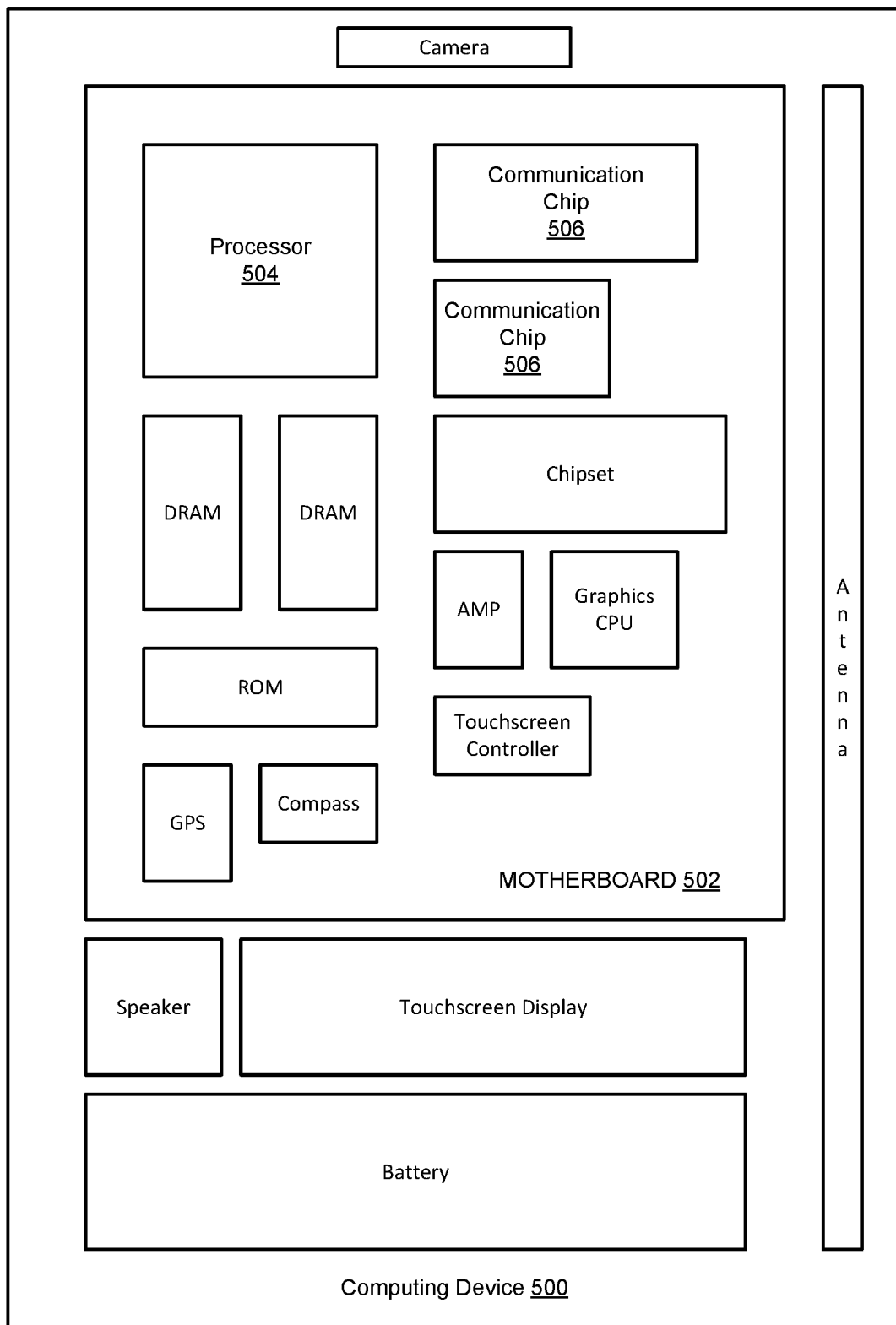
FIG. 5 is an example computing system implemented with one or more of the integrated circuit structures as disclosed herein, in accordance with an embodiment of the present disclosure.

FIG. 5 is an example computing system 500 implemented with one or more of the integrated circuit structures as disclosed herein, in accordance with an embodiment of the present disclosure. As can be seen, computing system 500 houses a motherboard 502. Motherboard 502 may include a number of components, including, but not limited to, a processor 504 and at least one communication chip 506, each of which can be physically and electrically coupled to motherboard 502, or otherwise integrated therein. As will be appreciated, motherboard 502 may be, for example, any printed circuit board, whether a main board, a daughterboard mounted on a main board, or the only board of system 500, etc.

Depending on its applications, computing system 500 may include one or more other components that may or may not be physically and electrically coupled to motherboard 502. These other components may include, but are not limited to, volatile memory (e.g., DRAM), non-volatile memory (e.g., read only memory (ROM)), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 500 may include one or more integrated circuit structures or devices configured in accordance with an example embodiment (e.g., to include one or more NMOS structures including high mobility, wide band gap semiconductor oxide material, as variously provided herein). In some embodiments, multiple functions can be integrated into one or more chips (e.g., for instance, note that communication chip 506 can be part of or otherwise integrated into processor 504).

Communication chip 506 enables wireless communications for the transfer of data to and from computing system 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 506 may implement any of a number of wireless standards or protocols, including, but not limited to, Wi-Fi (Institute of Electrical and Electronics Engineers (IEEE) 802.11 family), worldwide interoperability for microwave access (WiMAX) (IEEE 802.16 family), IEEE 802.20, long term evolution (LTE), 1× evolution-data optimized (Ev-DO), high speed packet access (HSPA+), high speed downlink packet access (HSDPA+), high speed uplink packet access (HSUPA+), enhanced data rates for GSM evolution (EDGE), global system for mobile communication (GSM), general packet radio service (GPRS), code division multiple access (CDMA), time division multiple access (TDMA), digital enhanced cordless telecommunications (DECT), Bluetooth, derivatives thereof, as well as any other wireless protocols that are designated as 3G, 4G, 5G, and beyond. Computing system 500 may include multiple communication chips 506. For instance, a first communication chip 506 may be dedicated to shorter range wireless communications such as Wi-Fi and Bluetooth, and a second communication chip 506 may be dedicated to longer range wireless communications such as GPS, EDGE, GPRS, CDMA, WiMAX, LTE, Ev-DO, and others. In some embodiments, communication chip 506 may include one or more NMOS structures including high mobility, wide band gap semiconductor oxide material as variously described herein.

Processor 504 of computing system 500 includes an integrated circuit die packaged within processor 504. In some embodiments, the integrated circuit die of the processor includes onboard circuitry that is implemented with one or more integrated circuit NMOS structures or devices having high mobility, wide band gap semiconductor oxide material as variously described herein. The term "processor" may refer to any device or portion of a device that processes, for instance, electronic data from registers and/or memory to transform that electronic data into other electronic data that may be stored in registers and/or memory.

Communication chip 506 also may include an integrated circuit die packaged within communication chip 506. In accordance with some such example embodiments, the integrated circuit die of the communication chip includes one or more integrated circuit NMOS structures or devices having high mobility, wide band gap semiconductor oxide material as variously described herein. As will be appreciated in light of this disclosure, note that multi-standard wireless capability may be integrated directly into processor 504 (e.g., where functionality of any chips 506 is integrated into processor 504, rather than having separate communication chips). Further note that processor 504 may be a chip set having such wireless capability. In short, any number of processor 504 and/or communication chips 506 can be used. Likewise, any one chip or chip set can have multiple functions integrated therein.

In various implementations, computing system 500 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 includes an integrated circuit structure including: a first fin comprising a semiconductor oxide material, the semiconductor oxide material including oxygen and one or more of indium (In), gallium (Ga), zinc (Zn), copper (Cu), tin (Sn), nickel (Ni), titanium (Ti), aluminum (Al), or antimony (Sb); a first gate structure over the first fin and in contact with the semiconductor oxide material, the first gate structure being part of an NMOS transistor device; a second fin comprising semiconductor material; and a second gate structure over the second fin and in contact with the semiconductor material of the second fin, the second gate structure being part of a PMOS device.

Example 2 includes the subject matter of Example 1, wherein the semiconductor oxide material is InGaZnO.

Example 3 includes the subject matter of Example 1, wherein the semiconductor oxide material is $InO_2$.

Example 4 includes the subject matter of Example 1, wherein the semiconductor oxide material is ITO.

Example 5 includes the subject matter of Example 1, wherein the semiconductor oxide material is InSbO.

Example 6 includes the subject matter of Example 1, wherein the semiconductor oxide material is ZnO.

Example 7 includes the subject matter of Example 1, wherein the semiconductor oxide material is AlZnO.

Example 8 includes the subject matter of Example 1, wherein the semiconductor oxide material is $Ga_2O_3$.

Example 9 includes the subject matter of Example 1, wherein the semiconductor oxide material is CuO.

Example 10 includes the subject matter of Example 1, wherein the semiconductor oxide material is $SnO_2$.

Example 11 includes the subject matter of Example 1, wherein the semiconductor oxide material is NiO.

Example 12 includes the subject matter of Example 1, wherein the semiconductor oxide material is $TiO_2$.

Example 13 includes the subject matter of Example 1, wherein the semiconductor oxide material is TiO.

Example 14 includes the subject matter of Example 1, wherein the semiconductor oxide material is SbO.

Example 15 includes the subject matter of Example 1, wherein the semiconductor oxide material is ZnSe.

Example 16 includes the subject matter of any of Examples 1 through 15, further including a substrate below the first and second fins, the substrate comprising silicon.

Example 17 includes the subject matter of any of Examples 1 through 16, wherein the second fin comprises at least one of silicon and germanium.

Example 18 includes the subject matter of any of Examples 1 through 17, wherein the first fin comprises a fin stub portion under and in direct contact with the semiconductor oxide material.

Example 19 includes an integrated circuit structure including: a first set of one or more fins including a first fin, the first fin comprising a wide band gap semiconductor oxide material, the wide band gap semiconductor oxide material includes oxygen and has a band gap in a range of 1.5 eV to 3 eV; a first gate structure over the first set of fins and in contact with the wide band gap semiconductor material, the first gate structure being part of an NMOS transistor device; a second set of one or more fins including a second fin, the second fin comprising silicon; a second gate structure over the second set of fins and in contact with the silicon of the second fin, the second gate structure being part of a PMOS transistor device; and a substrate below the fins, the substrate comprising silicon.

Example 20 includes the subject matter of Example 19, wherein the wide band gap semiconductor oxide material has an electron mobility in a range of about 50 cm$^2$/Vs to about 500 cm$^2$/Vs.

Example 21 includes the subject matter of Example 19, wherein the wide band gap semiconductor oxide material further includes one or more of indium (In), gallium (Ga), zinc (Zn), copper (Cu), tin (Sn), nickel (Ni), titanium (Ti), aluminum (Al), or antimony (Sb).

Example 22 includes the subject matter of any of Examples 19 through 21, wherein the wide band gap semiconductor oxide material is one of InGaZnO, InO$_2$, ITO, InSbO, ZnO, AlZnO, Ga$_2$O$_3$, CuO, SnO$_2$, NiO, TiO$_2$, TiO, SbO, and ZnSe.

Example 23 includes the subject matter of any of Examples 19 through 21, wherein the high mobility, wide band gap semiconductor oxide material is InGaZnO.

Example 24 includes the subject matter of any of Examples 19 through 21, wherein the wide band gap semiconductor oxide material is InO$_2$.

Example 25 includes the subject matter of any of Examples 19 through 21, wherein the wide band gap semiconductor oxide material is ITO.

Example 26 includes the subject matter of any of Examples 19 through 21, wherein the wide band gap semiconductor oxide material is InSbO.

Example 27 includes the subject matter of any of Examples 19 through 21, wherein the wide band gap semiconductor oxide material is ZnO.

Example 28 includes the subject matter of any of Examples 19 through 21, wherein the wide band gap semiconductor oxide material is AlZnO.

Example 29 includes the subject matter of any of Examples 19 through 21, wherein the wide band gap semiconductor oxide material is Ga$_2$O$_3$.

Example 30 includes the subject matter of any of Examples 19 through 21, wherein the wide band gap semiconductor oxide material is CuO.

Example 31 includes the subject matter of any of Examples 19 through 21, wherein the wide band gap semiconductor oxide material is SnO$_2$.

Example 32 includes the subject matter of any of Examples 19 through 21, wherein the wide band gap semiconductor oxide material is NiO.

Example 33 includes the subject matter of any of Examples 19 through 21, wherein the wide band gap semiconductor oxide material is TiO$_2$.

Example 34 includes the subject matter of any of Examples 19 through 21, wherein the wide band gap semiconductor oxide material is TiO.

Example 35 includes the subject matter of any of Examples 19 through 21, wherein the wide band gap semiconductor oxide material is SbO.

Example 36 includes the subject matter of any of Examples 19 through 21, wherein the wide band gap semiconductor oxide material is ZnSe.

Example 37 includes the subject matter of any of Examples 19 through 36, wherein the each of the NMOS transistor device and the PMOS transistor device has a non-planar configuration.

Example 38 includes the subject matter of any of Examples 19 through 37, wherein the each of the NMOS transistor device and the PMOS transistor device has a gate-all-around configuration.

Example 39 includes the subject matter of any of Examples 19 through 38, wherein the first set of fins includes multiple first fins.

Example 40 includes a method for forming an integrated circuit structure, the method including: forming a multiple fins on a substrate, the substrate comprising silicon (Si); removing a first fin of the multiple fins to provide a first fin trench; depositing a semiconductor oxide material into the first fin trench, the semiconductor oxide material includes oxygen and one or more of indium (In), gallium (Ga), zinc (Zn), copper (Cu), tin (Sn), nickel (Ni), titanium (Ti), aluminum (Al), or antimony (Sb); forming a first gate structure over the first fin and in contact with the semiconductor material, the first gate structure being part of an NMOS transistor device; and forming a second gate structure over a second fin of the multiple fins, the second gate structure being in contact with the Si of the second fin, the second gate structure being part of a PMOS transistor device.

Example 41 includes the subject matter of Example 40, further including: forming a first source region and a first drain region adjacent respective sides of the first gate structure; and forming a second source region and a second drain region adjacent respective sides of the first gate structure.

Example 42 includes the subject matter of Example 41, further including: forming respective first contact structures on the first source region and the first drain region; and forming respective second contact structures on the second source region and the second drain region.

Example 43 includes the subject matter of any of Examples 40 through 42, wherein the second fin comprises at least one of silicon and germanium.

Example 44 includes the subject matter of any of Examples 40 through 43, wherein the first fin comprises a fin stub portion under and in direct contact with the semiconductor oxide material.

Example 45 includes the subject matter of any of Examples 40 through 44, wherein each of the PMOS transistor device and the NMOS transistor device has a non-planar configuration.

Example 46 includes the subject matter of any of Examples 40 through 44, wherein at least one of the PMOS transistor device and the NMOS transistor device has a gate-all-around configuration.

Example 47 includes the subject matter of any of Examples 40 through 46, wherein the semiconductor oxide material is one of InGaZnO, InO$_2$, ITO, InSbO, ZnO, AlZnO, Ga$_2$O$_3$, CuO, SnO$_2$, NiO, TiO$_2$, TiO, SbO, and ZnSe.

Example 48 includes the subject matter of any of Examples 40 through 46, wherein the semiconductor oxide material is InGaZnO.

Example 49 includes the subject matter of any of Examples 40 through 46, wherein the semiconductor oxide material is InO$_2$.

Example 50 includes the subject matter of any of Examples 40 through 46, wherein the semiconductor oxide material is ITO.

Example 51 includes the subject matter of any of Examples 40 through 46, wherein the semiconductor oxide material is InSbO.

Example 52 includes the subject matter of any of Examples 40 through 46, wherein the semiconductor oxide material is ZnO.

Example 53 includes the subject matter of any of Examples 40 through 46, wherein the semiconductor oxide material is AlZnO.

Example 54 includes the subject matter of any of Examples 40 through 46, wherein the semiconductor oxide material is Ga$_2$O$_3$.

Example 55 includes the subject matter of any of Examples 40 through 46, wherein the semiconductor oxide material is CuO.

Example 56 includes the subject matter of any of Examples 40 through 46, wherein the semiconductor oxide material is SnO$_2$.

Example 57 includes the subject matter of any of Examples 40 through 46, wherein the semiconductor oxide material is NiO.

Example 58 includes the subject matter of any of Examples 40 through 46, wherein the semiconductor oxide material is TiO$_2$.

Example 59 includes the subject matter of any of Examples 40 through 46, wherein the semiconductor oxide material is TiO.

Example 60 includes the subject matter of any of Examples 40 through 46, wherein the semiconductor oxide material is SbO.

Example 61 includes the subject matter of any of Examples 40 through 46, wherein the semiconductor oxide material is ZnSe.

Example 62 includes the subject matter of any of Examples 40 through 46, wherein the semiconductor oxide material has an electron mobility in a range of about 50 cm$^2$/Vs to about 500 cm$^2$/Vs.

Example 63 includes the subject matter of any of Examples 40 through 46, wherein the semiconductor oxide material includes oxygen and has a band gap in a range of 1.5 eV to 3 eV.

Example 64 includes a method for forming an integrated circuit structure, the method including: forming multiple fins on a substrate, the substrate comprising silicon (Si); removing a first fin of the multiple fins to provide a first fin trench; depositing a wide band gap semiconductor oxide material into the first fin trench, the wide band gap semiconductor oxide material includes oxygen and has a band gap in a range of 1.5 eV to 3 eV; forming a first gate structure over the first fin and in contact with the wide band gap semiconductor material, the first gate structure being part of an NMOS transistor device; and forming a second gate structure over a second fin of the multiple fins, the second gate structure being in contact with the Si of the second fin, the second gate structure being part of a PMOS transistor device.

Example 65 includes the subject matter of Examples 64, wherein the wide band gap semiconductor oxide material has an electron mobility in a range of about 50 cm$^2$/Vs to about 500 cm$^2$/Vs.

Example 66 includes the subject matter of any of Examples 64 and 65, wherein the wide band gap semiconductor oxide material further includes one or more of indium (In), gallium (Ga), zinc (Zn), copper (Cu), tin (Sn), nickel (Ni), titanium (Ti), aluminum (Al), or antimony (Sb).

Example 67 includes the subject matter of any of Examples 64 through 66, wherein the wide band gap semiconductor oxide material is one of InGaZnO, InO$_2$, ITO, InSbO, ZnO, AlZnO, Ga$_2$O$_3$, CuO, SnO$_2$, NiO, TiO$_2$, TiO, SbO, and ZnSe.

Terms used in the present disclosure and in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

All examples and conditional language recited in the present disclosure are intended for pedagogical objects to aid the reader in understanding the present disclosure and the concepts contributed by the inventor to furthering the art, and are to be construed as being without limitation to such specifically recited examples and conditions. Although embodiments of the present disclosure have been described in detail, various changes, substitutions, and alterations could be made hereto without departing from the spirit and scope of the present disclosure. Accordingly, it is intended that the scope of the present disclosure be limited not by this detailed description, but rather by the claims appended hereto.

What is claimed is:

1. An integrated circuit structure, comprising:
a substrate comprising a semiconductor material;
a first fin comprising a semiconductor oxide material, the semiconductor oxide material of the first fin having a bottommost surface on and in direct contact with the semiconductor material of the substrate, the semiconductor oxide material having a composition different than a composition of the semiconductor material of the substrate, and the semiconductor oxide material including oxygen and one or more of indium (In), gallium (Ga), zinc (Zn), copper (Cu), tin (Sn), nickel (Ni), titanium (Ti), aluminum (Al), or antimony (Sb);
a first gate structure over the first fin and in contact with the semiconductor oxide material, the first gate structure being part of an NMOS transistor device;
a second fin comprising the semiconductor material of the substrate, the second fin continuous with the semiconductor material of the substrate; and
a second gate structure over the second fin and in contact with the semiconductor material of the second fin, the second gate structure being part of a PMOS device.

2. The integrated circuit structure of claim 1, wherein the semiconductor oxide material is InGaZnO.

3. The integrated circuit structure of claim 1, wherein the semiconductor oxide material is InO$_2$.

4. The integrated circuit structure of claim 1, wherein the semiconductor oxide material is ITO.

5. The integrated circuit structure of claim 1, wherein the semiconductor oxide material is InSbO.

6. The integrated circuit structure of claim 1, wherein the semiconductor oxide material is ZnO.

7. The integrated circuit structure of claim 1, wherein the semiconductor oxide material is AlZnO.

8. The integrated circuit structure of claim 1, wherein the semiconductor oxide material is $Ga_2O^3$.

9. The integrated circuit structure of claim 1, wherein the semiconductor oxide material is CuO.

10. The integrated circuit structure of claim 1, wherein the semiconductor oxide material is $SnO_2$.

11. The integrated circuit structure of claim 1, wherein the semiconductor oxide material is NiO.

12. The integrated circuit structure of claim 1, wherein the semiconductor oxide material is $TiO_2$.

13. The integrated circuit structure of claim 1, wherein the semiconductor oxide material is TiO.

14. The integrated circuit structure of claim 1, wherein the semiconductor oxide material is SbO.

15. The integrated circuit structure of claim 1, wherein the semiconductor oxide material is ZnSe.

16. d) A computing device, comprising:
    a board; and
    a component coupled to the board, the component including an integrated circuit structure, comprising:
        a first fin comprising a semiconductor oxide material, the semiconductor oxide material of the first fin having a bottommost surface on and in direct contact with the semiconductor material of the susbtrate, the semiconductor oxide material having a composition different than a composition of the semiconductor material of the substrate, and the semiconductor oxide material including oxygen and one or more of indium (In), gallium (Ga), zinc (Zn), copper (Cu), tin (Sn), nickel (Ni), titanium (Ti), aluminum (Al), or antimony (Sb);
        a first gate structure over the first fin and in contact with the semiconductor oxide material, the first gate structure being part of an NMOS transistor device;
        a second fin comprising the semiconductor material of the substrate, the second fin continuous with the semiconductor material of the substrate; and
        a second gate structure over the second fin and in contact with the semiconductor material of the second fin, the second gate structure being part of a PMOS device.

17. The computing device of claim 16, further comprising:
    a memory coupled to the board.

18. The computing device of claim 16, further comprising:
    a communication chip coupled to the board.

19. The computing device of claim 16, wherein the component is a packaged integrated circuit die.

20. The computing device of claim 16, wherein the component is selected from the group consisting of a processor, a communications chip, and a digital signal processor.

* * * * *